United States Patent [19]
Kim

[11] Patent Number: 5,982,220
[45] Date of Patent: Nov. 9, 1999

[54] HIGH SPEED MULTIPLEXER CIRCUIT

[75] Inventor: Yong Byum Kim, Kyoungki-do, Rep. of Korea

[73] Assignee: Hyundai Electronics Industries Co., Ltd., Kyoungki-do, Rep. of Korea

[21] Appl. No.: 08/998,031

[22] Filed: Dec. 24, 1997

[30] Foreign Application Priority Data

Dec. 27, 1996 [KR] Rep. of Korea ................. 96-73674

[51] Int. Cl.⁶ .................. H03K 17/62; H03K 17/693
[52] U.S. Cl. .............................. 327/408; 327/99
[58] Field of Search ................. 327/99, 407, 408, 327/410, 411, 413, 403, 404, 405

[56] References Cited

U.S. PATENT DOCUMENTS

| | | | |
|---|---|---|---|
| 5,436,574 | 7/1995 | Veenstra | 326/39 |
| 5,543,731 | 8/1996 | Sigal et al. | 326/40 |
| 5,578,946 | 11/1996 | Carberry et al. | 326/93 |
| 5,648,925 | 7/1997 | Curtet et al. | 364/284.04 |
| 5,654,660 | 8/1997 | Orgill et al. | 327/407 |
| 5,815,024 | 9/1998 | Reddy et al. | 327/408 |
| 5,835,045 | 11/1998 | Ogawa et al. | 341/155 |

*Primary Examiner*—My-Trang Nuton
*Attorney, Agent, or Firm*—Jacobson, Price, Holman & Stern, PLLC

[57] ABSTRACT

A multiplexer circuit in which high speed operation and high integration can be achieved by distributing the parasitic capacitance generated in the common output stage of pass transistor. A multiplexer circuit which outputs any one of input signals of 1 to n, input to the n pass transistors after selecting it at the common output stage, in response to the the selection signal of 1 to n (n=a natural number), comprising; input means receiving 1 to i input signals (1<i<n); a first switching means which select any one of the input signals in response to the 1 to i selection signals and output it to a first common output stage; a second switching means which select any one of the i+1 to n input signals in response to the i+1 to n selection signals and output it to a second common output stage; and an output means which has input stage connected to the first common output stage and output stage connected to the second common output stage and outputs the final output signal to the external circuit.

6 Claims, 2 Drawing Sheets

HIGH SPEED MULTIPLEXER CIRCUIT

BACKGROUND OF THE INVENTION

1. Field of the Invention

The present invention relates generally to a digital circuit, more particularly to a multiplexer circuit in which high speed operation and high integration can be achieved.

As is well known, the multiplexer is a device which selects and outputs any one of n input data in response to the control signal, and the technology has been developed for its high speed operation and high integration.

2. Description of Prior Art

FIG. 1 shows conventional multiplexer circuit of n to 1. The multiplexer circuit comprises n inverters $I_0$ to $I_{n-1}$ which are connected to n inputs $b_0$ to $b_{n-1}$; n pass transistors $T_0$ to $T_{n-1}$ which have n inverter outputs as inputs at their one ends, have selection signals $a_0$ to $a_{n-1}$ at their gates and have common node at their other ends; and a inverter 10 which is connected to the common node at the other ends of the pass transistor and outputs the inverted signals of selected final data.

If an arbitrary input signal $b_j$ ($0 \leq j \leq n-1$) is selected by the selection signal induced at the gates of each pass transistor, the input signal is inverted at the inverter $I_j$ and passes to the pass transistor. Then, the input signal passes the common node a and is inverted at the inverter 10. The final output signal is the signal inverted at the inverter 10.

In the conventional multiplexer circuit described above, as the number of the bit of input data increases, the parasitic capacitance caused at the common node becomes large. The parasitic capacitance is generated additionally in the semiconductor device and does not exist in the circuit actually. Because of the large capacitance at the other ends of pass transistor, the delay time between input stage and output stage becomes long. Also, since all of n input stages has their inverters, the total size of circuit becomes large.

SUMMARY OF THE INVENTION

The object of present invention is to provide a multiplexer circuit which operates at a high speed by dispersing the parasitic capacitance generated at the common output stage of pass transistors and is integrated highly with ease reducing the circuit area.

BRIEF DESCRIPTION OF THE DRAWINGS

The foregoing object, aspects and advantages will be better understood from the following detailed description of preferred embodiment of the invention with reference to the drawings, in which.

DETAILED DESCRIPTION OF THE PREFERRED EMBODIMENTS

According to the preferred embodiment of the invention, the multiplexer circuit which outputs any one of input signals of 1 to n, input to the n pass transistors after selecting it at the common output stage, in response to the the selection signal of 1 to n (n=a natural number), comprises input means receiving 1 to i input signals (1<i <n); a first switching means which select any one of the input signals in response to the 1 to i selection signals and output it to a first common output stage; a second switching means which select any one of the i+1 to n input signals in response to the i+1 to n selection signals and output it to a second common output stage; and an output means which has input stage connected to the first common output stage and output stage connected to the second common output stage and outputs the final output signal to the external circuit.

Figure 1:
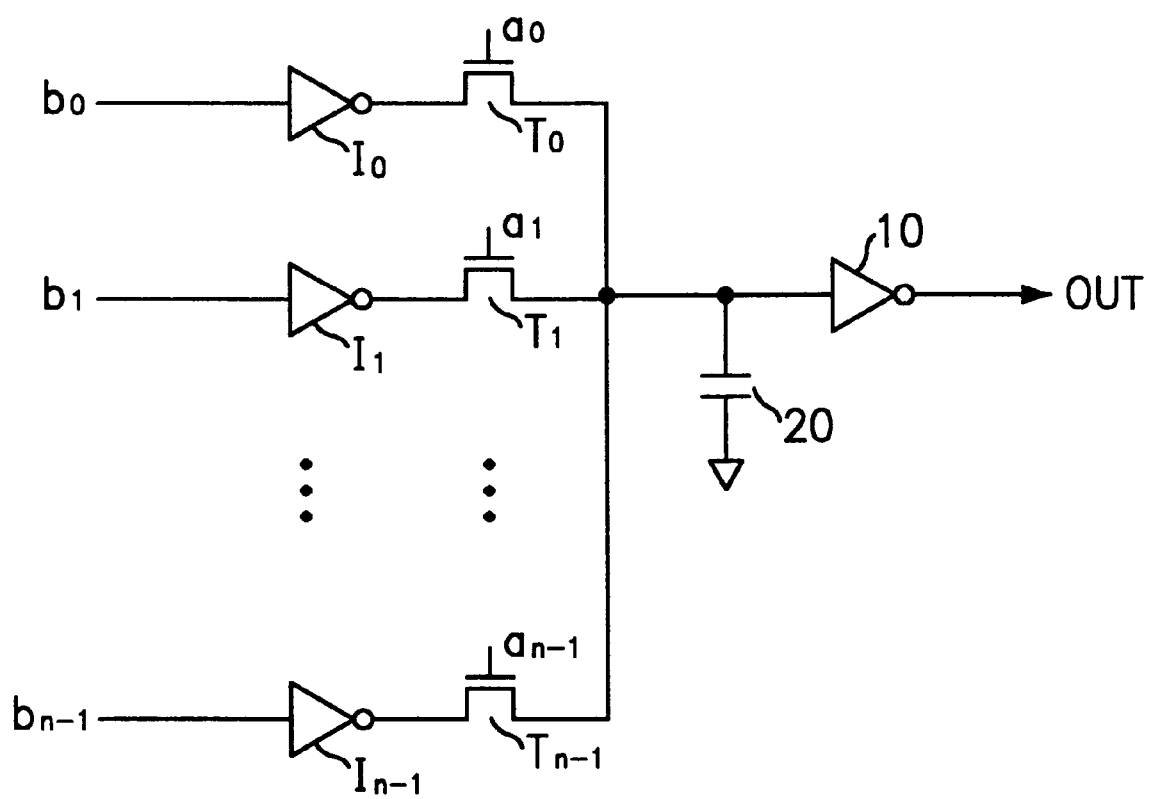
FIG. 1 shows a conventional multiplexer circuit.
Figure 2:
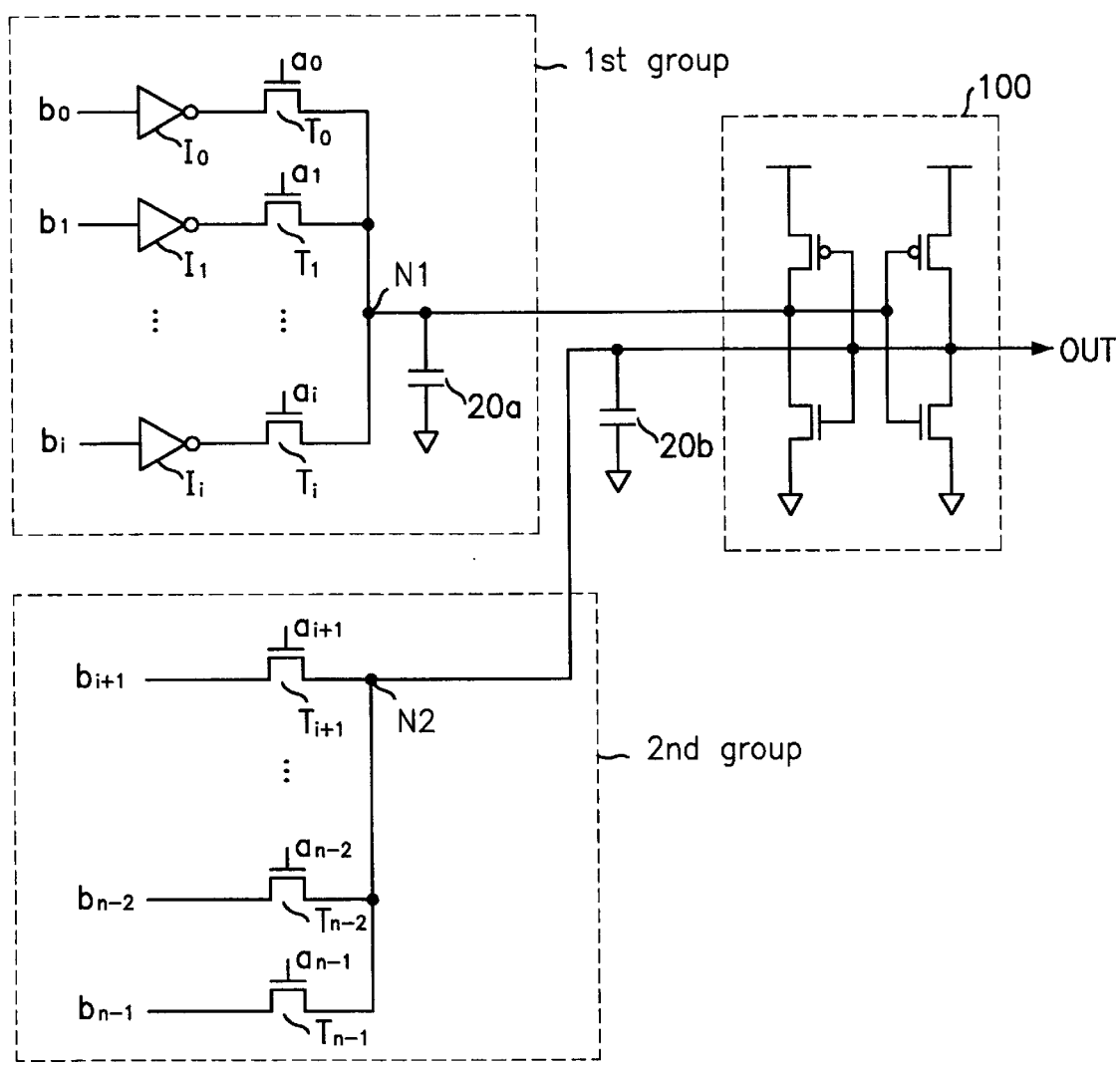
FIG. 2 shows a multiplexer circuit in accordance with one embodiment of present invention.

FIG. 2 shows the multiplexer circuit in accordance with one embodiment of present invention.

As can be seen in the drawing, the input signals $b_0$ to $b_{n-1}$ and pass transistors $T_0$ to $T_{n-1}$ of the multiplexer circuit according to the embodiment can be divided into two groups. That is, the input signals and pass transistors can be divided into the first group with high speed relatively and the second group with low speed relatively. The inverters $I_0$ to $I_i$ are formed at the input stage of the first group and invert input signals $b_0$ to $b_i$ input to the pass transistors $T_0$ to $T_i$ and the input signals $b_{i+1}$ to $b_{n-1}$ are not input to the pass transistors $T_{i+1}$ to $T_{n-1}$ without inverting of them. Also, the output stage of the multiplexer circuit is composed of a latch circuit in which two inverters make latch each other, instead of inverter 10 in the conventional art. The input stage of latch circuit 100 is connected to the output stage node N1 of the first group and the output stage of the latch circuit 100 is connected to the output stage N2 of the second group.

If any one of input signals $b_0$ to $b_i$ is output to the output stage N1 by the selection signals $a_0$ to $a_i$ in the first group in which the speed of signals is high relatively, the output stage N2 of the second group in which the speed of signals is low relatively is in the state of floating. Also, the output of the first group is inverted in the latch circuit 100 and comes out to the final output terminal. On the other hand, if any one of input signals $b_{i+1}$ to $b_{n-1}$ is output to the output stage N2 by the selection signals $a_{i+1}$ to $a_{n-1}$ of the second group in which the speed of signals is low relatively, the output stage N1 is in the state of floating. And, the output of the second group determines the value of output stage N1 of the first group and output of the multiplexer. Therefore, the function of multiplexer can be performed suitably.

Accordingly, the parasitic capacitance concentrated on the common node in the conventional art can be distributed to each of output stages N1 and N2 of the first group and the second group, and the high speed operation can be obtained. The delay time is expressed as follows, $$\Delta t = \text{cap} \cdot 1/i \cdot \Delta V.$$

In the multiplexer circuit of present invention, since the capacitance cap is divided into each group, that is, ½, total delay time $\Delta t$ can be reduced to ½ $\Delta t$.

Also, all of input signals are input through inverters in the input stage in the conventional art. However, input signals in the only one group of total two groups are input through inverters. Therefore, though one inverter is added in the latch circuit of output stage, total number of inverter and total circuit area can be reduced substantially.

As apparent from the above description, it is possible to provide a multiplexer circuit which operates at a high speed by dispersing the parasitic capacitance generated at the common output stage of pass transistors and is integrated highly with ease reducing the circuit area.

While the invention has been described in terms of a single preferred embodiment, those skilled in the art will recognized that the invention can be practiced with modification within the spirit and scope of the appended claims.

What is claimed is:

1. A high speed multiplexer circuit which outputs any one of input signals of 1 to n, input to the n pass transistors after selecting it at the common output stage, in response to the selection signal of 1 to n (n=a natural number), comprising;

input means receiving 0 to i input signals (0<i <n);

a first switching means which selects any one of the input signals in response to the 1 to i selection signals and outputs a first output to a first common output stage;

a second switching means which selects any one of the i+1 to n input signals in response to the i+1 to n selection signals and outputs a second output to a second common output state; and an output means including an input stage which receives the first output of the first common output stage and an output stage which receives the second output of the second common output stage, wherein the output means outputs a final output signal to the external circuit.

2. The multiplexer circuit according to claim 1, wherein a speed of 1 to i input signals is higher than a speed of i+1 to n input signals.

3. The multiplexer circuit according to claim 1, wherein the input means comprise i inverter means which receive 1 to i input signals and output them respectively.

4. The multiplexer circuit according to claim 3, wherein the first switching means are composed of 1 to i pass transistors which receive the signals output from the 1 to i inverter means at their one ends, receive the 1 to i selection signals at their gates, and have common connection at their other ends.

5. The multiplexer circuit according to claim 1, wherein the second switching means are composed of i+1 to n pass transistors which receive the signals output from the i+1 to n inverter means at their one ends, receive the i+1 to n selection signals at their gates, and have common connection at their other ends.

6. The multiplexer circuit according to claim 1, wherein the output means is a latch circuit including two inverters, wherein an input of a first inverter is connected to an output of a second inverter and an input of the second inverter is connected to an output of the first inverter.

* * * * *